(12) United States Patent
Kim

(10) Patent No.: US 8,243,496 B2
(45) Date of Patent: Aug. 14, 2012

(54) RESISTIVE MEMORY DEVICE AND WRITING METHOD THEREOF

(75) Inventor: Ho-Jung Kim, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 507 days.

(21) Appl. No.: 12/458,085

(22) Filed: Jun. 30, 2009

(65) Prior Publication Data

US 2010/0027315 A1  Feb. 4, 2010

(30) Foreign Application Priority Data

Jul. 31, 2008 (KR) .................. 10-2008-0075237

(51) Int. Cl.
*G11C 11/21* (2006.01)
*G11C 7/12* (2006.01)
(52) U.S. Cl. .................... 365/148; 365/189.03; 365/203
(58) Field of Classification Search ............. 365/185.25, 365/148, 163, 189.03, 189.05, 203
See application file for complete search history.

(56) References Cited

U.S. PATENT DOCUMENTS

| | | | |
|---|---|---|---|
| 6,396,764 B1 * | 5/2002 | Holland | 365/230.03 |
| 2007/0058425 A1 * | 3/2007 | Cho et al. | 365/163 |
| 2007/0206403 A1 | 9/2007 | Shirahama et al. | |
| 2007/0255891 A1 * | 11/2007 | Chow et al. | 711/103 |
| 2008/0137402 A1 * | 6/2008 | Cho et al. | 365/163 |
| 2008/0253177 A1 * | 10/2008 | Hsu et al. | 365/163 |
| 2009/0122592 A1 * | 5/2009 | Tokiwa | 365/148 |
| 2010/0128516 A1 * | 5/2010 | Cho et al. | 365/163 |
| 2010/0232208 A1 * | 9/2010 | Maejima et al. | 365/148 |

FOREIGN PATENT DOCUMENTS

| | | |
|---|---|---|
| JP | 2005-092912 | 4/2005 |
| KR | 10-0587702 | 6/2006 |

* cited by examiner

*Primary Examiner* — Douglas King
(74) *Attorney, Agent, or Firm* — Harness, Dickey & Pierce, P.L.C.

(57) ABSTRACT

A resistive memory device operates to sequentially activate bit lines, which are divided into plural groups, after precharging all of word and bit lines in a writing operation. The device is able to write a large amount of data therein at a high frequency, with a reduced the chip size.

13 Claims, 18 Drawing Sheets

RESISTIVE MEMORY DEVICE AND WRITING METHOD THEREOF

FOREIGN PRIORITY STATEMENT

This U.S. non-provisional patent application claims priority under 35 U.S.C. §119 to Korean Patent Application No. 10-2008-75237, filed on Jul. 31, 2008, in the Korean Intellectual Property Office (KIPO), the entire contents of which are incorporated herein by reference.

BACKGROUND

The present invention disclosed herein relates to a resistive memory device and a writing method thereof.

Resistive memories, which have recently sparked much interest on the next generation technology of nonvolatile memories, are regarded as capable of replacing flash memories. The resistive memory can be made through a nonvolatile memory technique, in which data is written by applying an electrical signal to a resistive material of film in a memory cell and varying resistance of the resistive material.

SUMMARY OF THE INVENTION

The present invention is directed to a resistive memory device suitable for large capacity and a writing method thereof.

The present invention is also directed to improvement for a method of writing data into a resistive memory.

An aspect of the present invention is a writing method of a resistive memory device, including: precharging pluralities of word and bit lines; dividing the plural bit lines into pluralities of bit line groups and setting up the plural bit line groups in sequence; and applying a writing voltage to a selected one of the plural word lines.

In an embodiment, after a writing operation to resistive memory cells corresponding to a first one of the bit line groups, the bit lines belonging to a second bit-line group are set up and the bit lines belonging to the first bit-line group are precharged, simultaneously, while performing a writing operation to resistive memory cells corresponding to the second bit-line group.

In an embodiment, precharging the bit lines of the first bit-line group includes applying a precharging voltage to each of the bit lies of the first bit-line group.

In an embodiment, setting up the bit lines of the second bit-line group includes applying a write-inhibit voltage to each bit line of the second bit-line group not being written to, and applying a writing voltage to each bit line of the second bit-line group being written to.

In an embodiment, the resistive memory device conducts a reset operation independently from a set operation in a writing mode.

In an embodiment, the reset operation is performed for all of the resistive memory cells coupled to the selected word line and performed for each of the plurality of the bit line groups in sequence.

In an embodiment, the set operation is performed selectively for all of the resistive memory cells coupled to the selected word line, which are to be set and have been reset, the set operation being performed by the bit lines in sequence.

In an embodiment, the resistive memory device performs reset and set operations simultaneously in a writing mode.

In an embodiment, input data is configured in the unit of cluster.

Another aspect of the present invention is a resistive memory device including: a memory cell array having pluralities of resistive memory cells arranged on intersections of pluralities of word and bit lines; a row decoder selecting a word line by decoding an input address; a cluster buffer temporarily storing data input during a writing mode, and temporarily storing data read from the memory cell array in a reading mode; and a control logic circuit, after precharging the word and bit lines in the writing mode, controlling the row decoder and the cluster buffer to apply a writing voltage to a selected word line and to sequentially perform a bit-line setup in the unit of bit line group.

In an embodiment, the control logic unit is configured so that, after a writing operation to resistive memory cells corresponding to a first one of the bit line groups, the control logic unit controls bit lines belonging to a second bit-line group to be set up and the bit lines belonging to the first bit-line group to be precharged, simultaneously, during writing operation to resistive memory cells corresponding to the second bit-line group.

In an embodiment, the cluster buffer comprises writing buffers connected to each of the bit lines. Each writing buffer includes a latch holding data corresponding with reset and set operations in the writing mode.

In an embodiment, wherein each writing buffer further comprises a transistor configured to enable a writing operation based on data held in the latch.

In an embodiment, each writing buffer further comprises an inverter configured to enable a writing operation based on data held in the latch.

In an embodiment, each resistive memory cell includes: a variable resistor having a phase-changeable material with two different resistance values corresponding to crystalline and amorphous states, respectively; and an access element controlling a current flowing through the variable resistor.

According to the present invention, the resistive memory device is configured to enable the writing operation with a large amount of data by means of the cluster buffer. The device operates to sequentially activate bit lines, which are divided into plural groups, after precharging all of word and bit lines in the writing operation. Thereby, the resistive memory device is able to write a large amount of data in high frequency.

Moreover, the cluster buffer simply organized is used to replace the conventional writing and reading drivers therewith, so it reduces the whole chip size of the resistive memory device.

A further understanding of the nature and advantages of the present invention herein may be realized by reference to the remaining portions of the specification and the attached drawings.

BRIEF DESCRIPTION OF THE FIGURES

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EXAMPLE EMBODIMENTS

Figure 1:
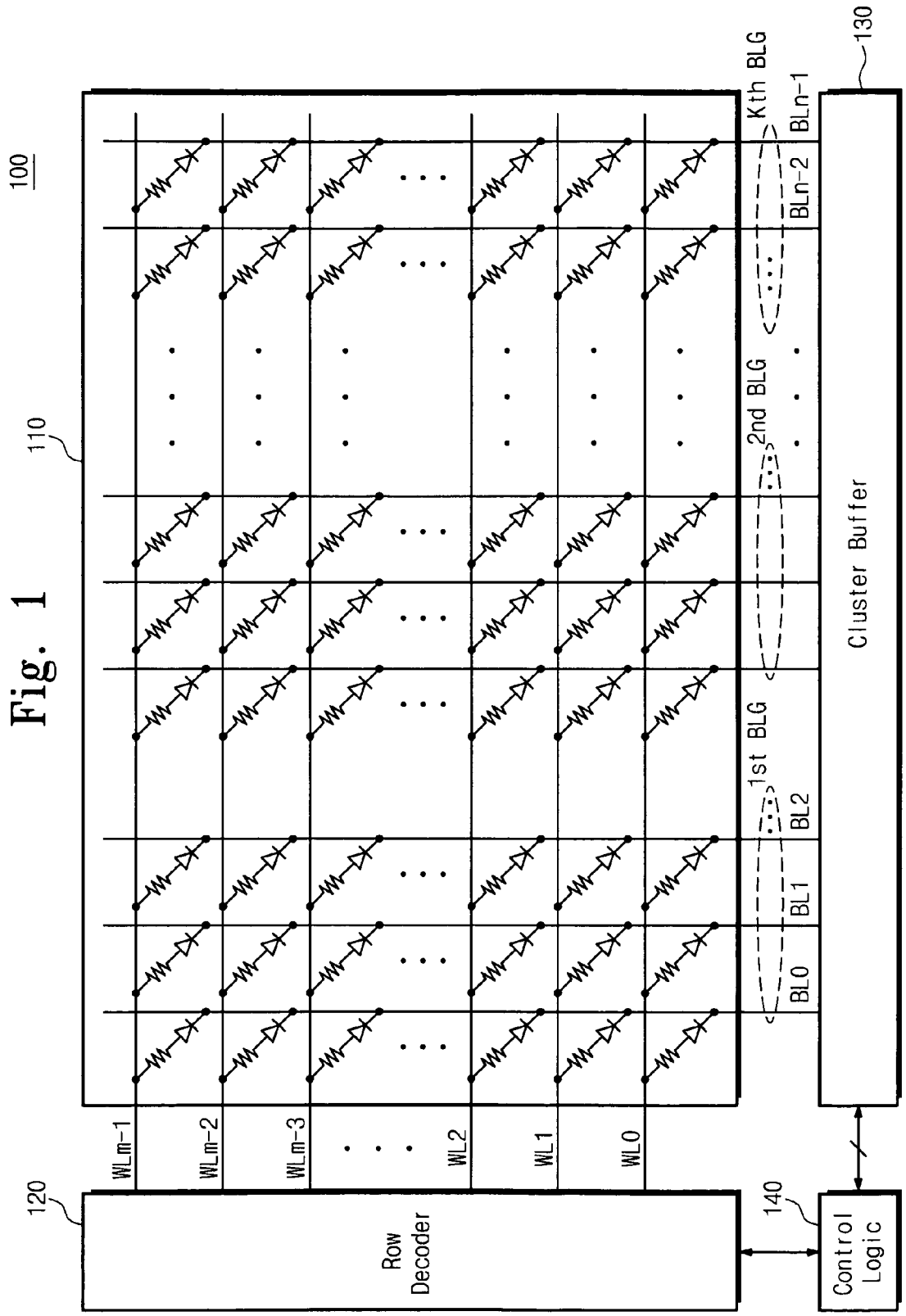
FIG. 1 is a diagram illustrating an embodiment of a resistive memory device according to the present invention.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

The resistive memory device of the present invention is configured to enable a writing operation with a large amount of data by means of the cluster buffer. The device operates to sequentially activate bit lines, which are divided into plural groups, after precharging all of word and bit lines in the writing operation. Thereby the resistive memory device is able to write a large amount of data at a high frequency.

FIG. 1 is a diagram illustrating an embodiment of a resistive memory device 100 according to the present invention. Referring to FIG. 1, the resistive memory device 100 is comprised of a memory cell array 110, a row decoder 120, a cluster buffer 130, and a control logic circuit 140. The resistive memory device 100 is operable with a writing operation in the unit of cluster. A cluster is a minimum or reference unit of sectors processed by a host (not shown), which may be one or plural sectors. Here, a host may employ the resistive memory device of the present invention as a storage unit.

The memory cell array 110 includes pluralities of resistive memory cells arranged in a form of matrix. The resistive memory cells are coupled between pluralities of word lines WL0~WLm-1 and bit lines BL0~BLn-1. Each resistive memory cell is organized of a variable resistor of phase-changeable material having two resistance values different from each other corresponding to a crystalline or amorphous state, respectively, and an access element for controlling a current flowing through the variable resistor. The access element may be a coupling diode or transistor serially connected to the variable resistor.

FIG. 1 shows the access elements made of coupling diodes. A phase-changeable material for the variable resistor can be formed by various compounds including, for example, a 2-element compound that is GaSb, InSb, InSe, $Sb_2Te_3$, or GeTe, a 3-element compound that is GeSbTe, GaSeTe, InSbTe, SnSbTe4, or InSbGe, or a 4-element compound that is AgInSbTe, (GeSn)SbTe, GeSb(SeTe), or $Te_{81}Ge_{15}Sb_2S_2$.

The row decoder 120 is configured to select a word line, upon which the writing operation is conducted, in response to a row address input into the row decoder 120. A writing voltage Vwrite for a writing operation mode is applied to the selected word line.

The cluster buffer 130 receives data from an external source in the unit of cluster and either temporarily stores the received data during the writing operation mode, or reads data from the memory cell array 110 and temporarily stores the read data during a reading operation mode. The cluster buffer 130 may be sized to be suitable for a maximum or reference cluster unit used by a connected host. Here, the term 'cluster buffer' means that the cluster buffer is able to process (read/write) data in correspondence with the cluster unit of a host.

The cluster buffer 130 includes reading/writing buffers (not shown) connected each to bit lines BL0~BLn-1. The reading/writing buffers are divided into bit line groups BLG1~BLGk. During the writing operation mode, the reading/writing buffers operate to activate the bit lines BL0~BLn-1 from the 1st group BLG1 to kth group BLGk.

The control logic circuit 140 is configured to generally control the resistive memory device 100.

The resistive memory device 100 is comprised of the cluster buffer 130 for storing a large amount of data in the unit of cluster. Here, a cluster is a minimum or reference logical unit for managing a memory system. The cluster buffer 130 functions as a reading driver during the reading operation mode. Thereby, the resistive memory device 100 of the present invention is able to conduct the writing and reading operations with a large amount of data.

Figure 2:
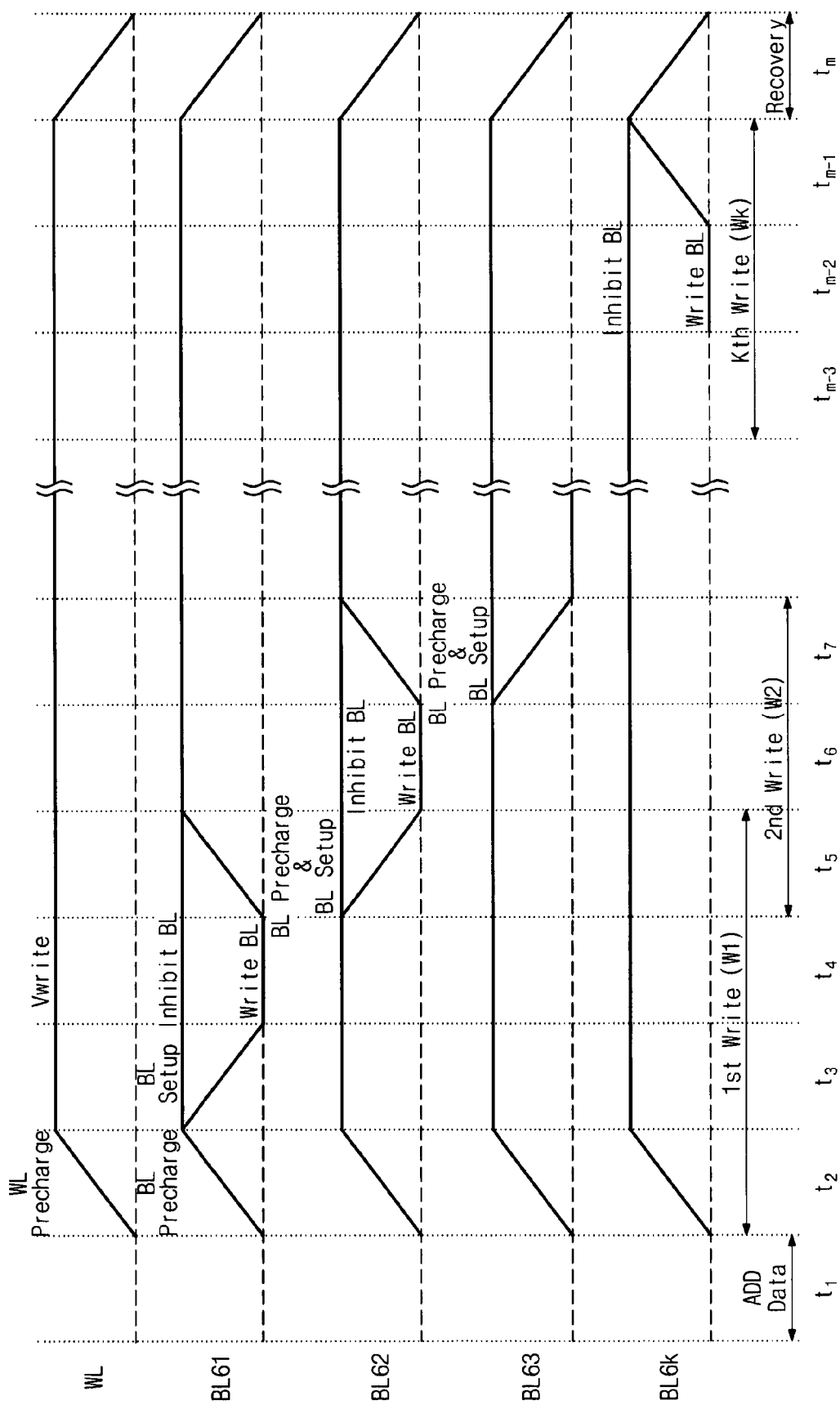
FIG. 2 is a timing diagram showing a writing operation of the resistive memory device according to the present invention.

FIG. 2 is a timing diagram showing the writing operation of the resistive memory device 100 according to the present invention. Referring to FIGS. 1 and 2, the writing operation of the resistive memory device 100 is carried out with writing periods W1~Wk by the bit line groups.

In a data loading period, at time t1, a word line upon which the writing operation is conducted is selected according to a row address ADD and data is input into the cluster buffer 130.

In a precharging time of the first writing period W1, at time t2, the selected word line and the bit lines BL0~BLn-1 are precharged up to predetermined levels. The precharging voltage of Vwrite is applied to a selected word line and the ground voltage (0V) is applied to unselected word lines. The precharging voltage of Vwrite is also precharged to the bit lines BL0~BLn-1. While the unselected word lines are supplied with the ground voltage of 0V in this embodiment, in an alternative embodiment, it is permissible to apply the ground voltage 0V to all of the word lines WL0~WLm-1. In the alternative embodiment, the writing voltage Vwrite is applied to a selected word line in an execution period of the writing operation mode.

In a bit-line setup time of the first writing period W1, at time t3, a write-inhibition voltage (e.g., Vwrite) is applied to bit lines of the 1st group BLG1, which are not to be written, while the writing voltage (e.g., the ground voltage 0V) is applied to the rest of the bit lines of the 1st group BLG1 which are to be written.

In an execution time of the first writing period W1, at time t4, the writing voltage Vwrite is applied to the selected word line for a predetermined or reference duration. Thereby, the writing operation is completed for the resistive memory cells coupled to the selected word line and the 1st group BLG1.

At time t5, the precharging voltage of Vwrite is applied to the bit lines of the 1st group BLG1 in order to perform a second writing period W2. Simultaneously, a bit-line setup operation of the second writing period W2 progresses.

At time t5, during the bit-line setup time of the second writing period W2, a write-inhibition voltage (e.g., Vwrite) is applied to bit lines of the 2nd group BLG2, which are not to be written, while the writing voltage (e.g., the ground voltage 0V) is applied to the rest of the bit lines of the 2nd group BLG2 which are to be written.

At time t6, during an execution time of the second writing period W2, the writing voltage Vwrite is applied to the selected word line for a predetermined duration. Thereby, the writing operation is completed for the resistive memory cells coupled to the selected word line in correspondence with the 2nd group BLG2.

The writing operation described above with reference to first and second bit line groups BLG1 and BLG2 is repeated for the resistive memory cells coupled to the selected word line until completing the kth writing period Wk. Then, the writing operation ends for the selected word line.

Afterward, at time tm, in a discharging (i.e., recovery) period, the ground voltage is applied to the word lines WL0~WLm-1 and the bit lines BL0~BLn-1.

The resistive memory device 100 of the present invention conducts the bit-line precharging operation for each bit line groups simultaneously with the setup operation of the next bit line group as shown in FIG. 2. Accordingly, writing periods W1~Wk overlap each other and a time for completing a writing operation is shortened.

FIGS. 3 through 6 are circuit diagrams illustrating several embodiments of the writing buffer of the cluster buffer 130 according to the present invention.

Figure 3:
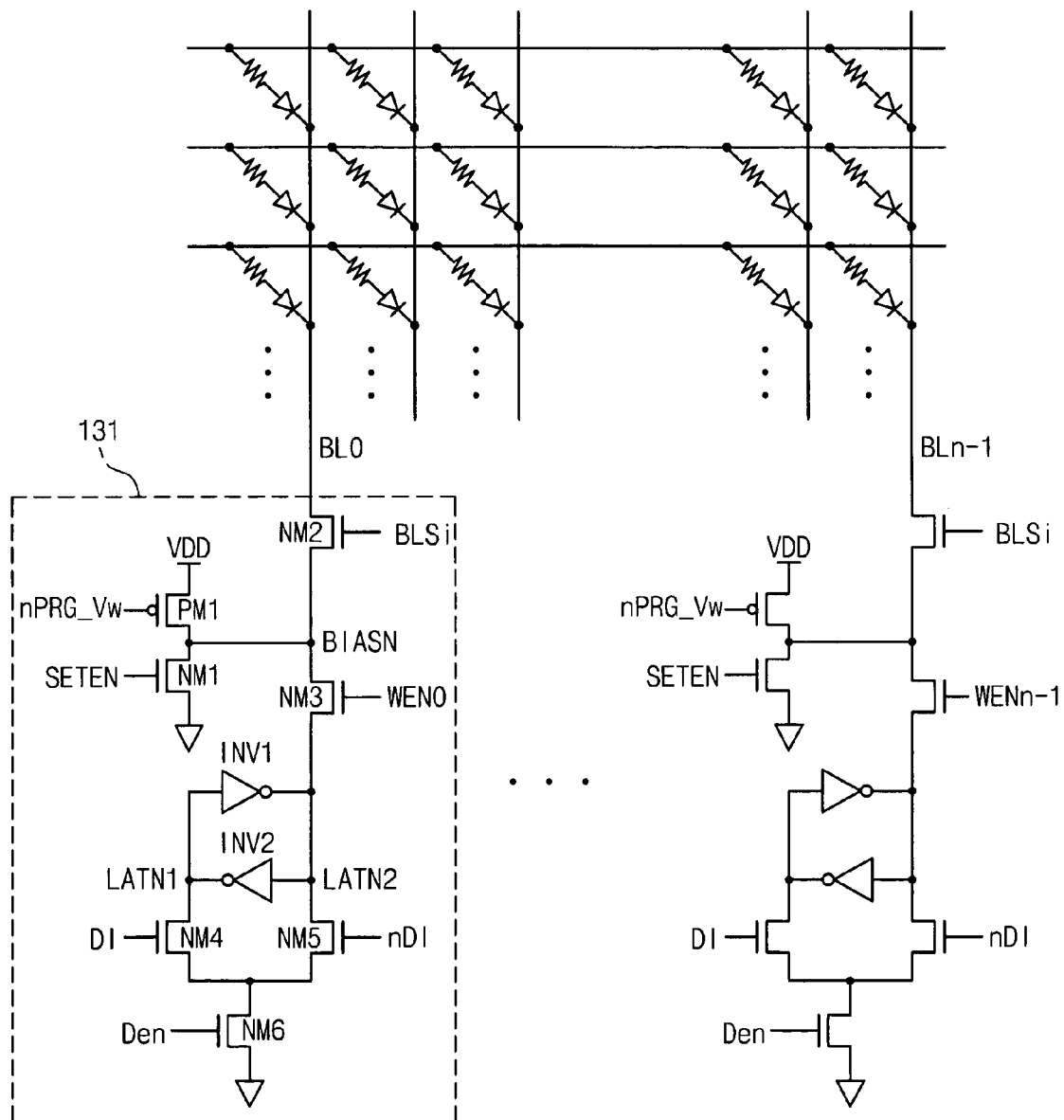
FIG. 3 is a circuit diagram illustrating a first embodiment of the writing buffer according to the present invention.

FIG. 3 is a circuit diagram illustrating a first embodiment of the writing buffer 131 according to the present invention. Referring to FIG. 3, the writing buffer 131 is comprised of a first PMOS transistor PM1, first through sixth NMOS transistors NM1~NM6, and inverters INV1 and INV2.

The first PMOS and NMOS transistors PM1 and NM1 operate to set a bias voltage BIASN. The first PMOS transistor PM1 provides the writing voltage Vwrite to the bias node BIASN in response to a write-voltage applying signal nPRG_Vw. The first NMOS transistor NM1 grounds the bias node BIASN in response to a setup-enabling signal SETEN. The write-voltage applying signal BIASN and the setup-enable signal SETEN are supplied from the control logic circuit 140. The control logic circuit 140 operates to control general operations of the resistive memory device 100.

The second NMOS transistor NM2 operates to select a bit line (e.g., BL0) in response to a bit-line selection signal BLSi. The bit-line selection signal BLSi is provided from the control logic circuit 140.

The third NMOS transistor NM3 transfers latched data to a resistive memory cell through the bit line BL0 in response to a writing-enable signal WEN0. The writing buffers 131 are provided the writing-enable signals WEN0~WENn-1 different to each other. The writing buffers belonging to the same bit line group are provided with the same writing-enable signal. The writing-enable signals WEN0~WENn-1 are applied to activate the plural bit line groups BLG1~BLGk in sequence. The writing-enable signals WEN0~WENn-1 are supplied from the control logic circuit 140.

The fourth through sixth NMOS transistors NM4~NM6 operate to latch data that is loaded into the cluster buffer 130. When data is to be loaded into a first latch node LATN, the fourth NMOS transistor NM4 is turned on in response to a data input signal DI while the sixth NMOS transistor NM6 is turned on in response to a data-enable signal Den. When data is to be loaded into a second latch node LATN2, the fifth NMOS transistor NM5 is turned on in response to an inverse data input signal nDI while the sixth NMOS transistor NM6 is turned on in response to the data-enable signal Den. The data-enable signal Den, the data input signal DI, and the inverse data input signal nDI are provided from the control logic circuit 140.

The first and second inverters INV1 and INV2 are oppositely connected between the first and second latch nodes LATN1 and LATN2, latching data that is loaded into the cluster buffer 130 or latching data that is read from a resistive memory cell.

Figure 4:
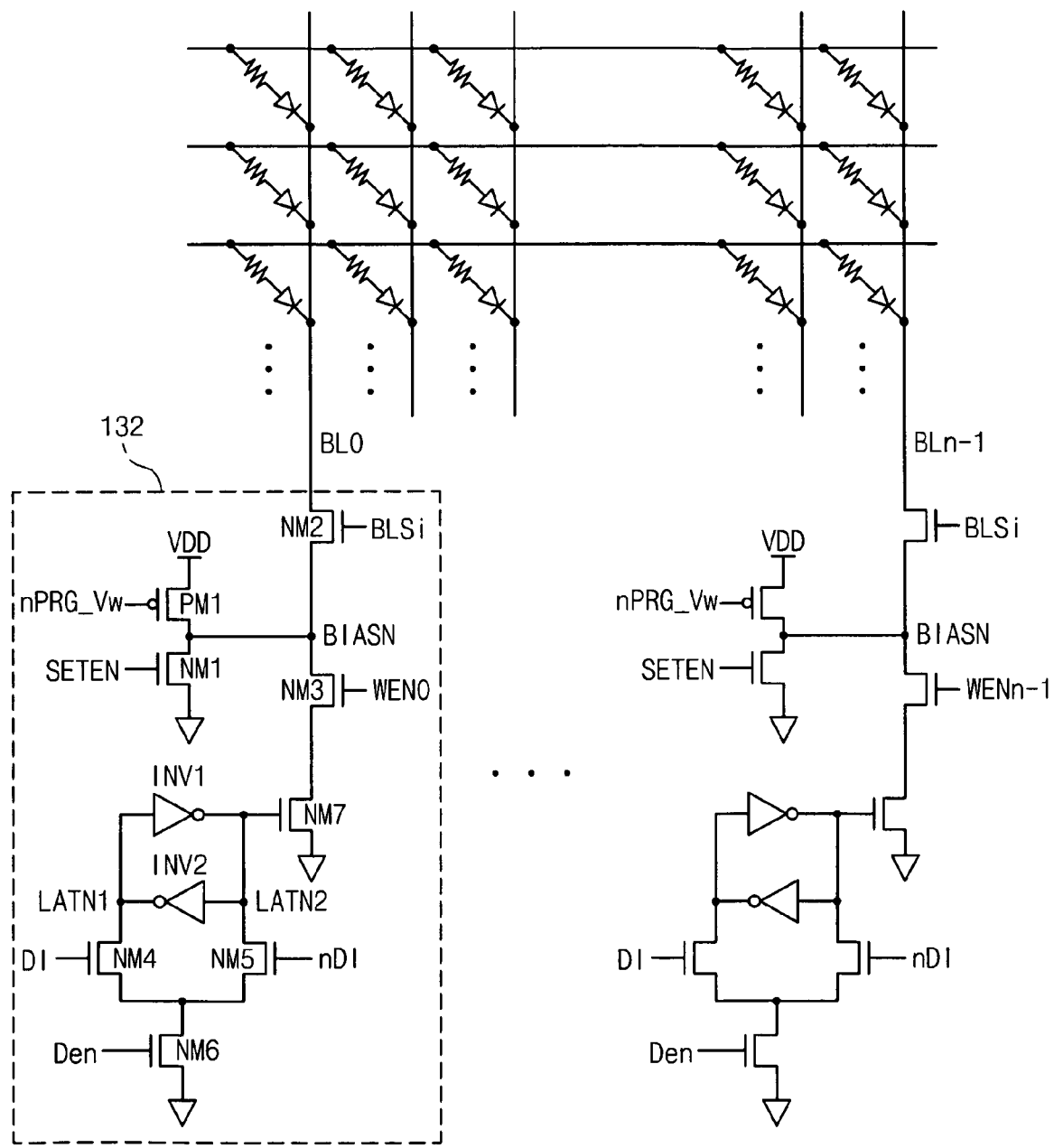
FIG. 4 is a circuit diagram illustrating a second embodiment of the writing buffer according to the present invention.

FIG. 4 is a circuit diagram illustrating a writing buffer 132 according to a second embodiment of the present invention. Referring to FIG. 4, the writing buffer 132 is further comprised of an NMOS transistor NM7, relative to the writing buffer 131 shown in FIG. 3, enabling a writing operation when data held at the second latch node LATN2 is '1'.

Figure 5:
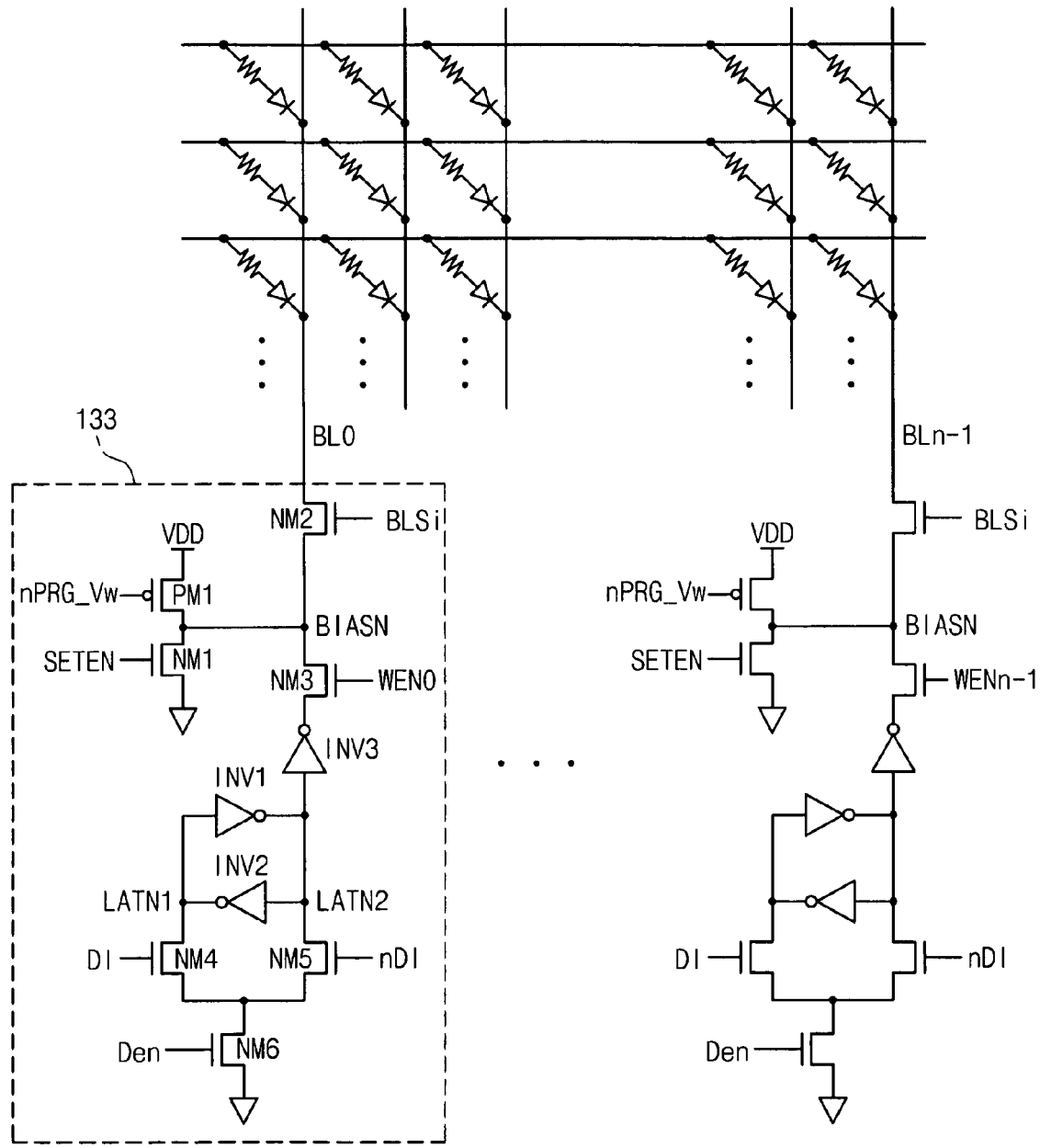
FIG. 5 is a circuit diagram illustrating a third embodiment of the writing buffer according to the present invention.

FIG. 5 is a circuit diagram illustrating a writing buffer 133 according to a third embodiment of the present invention. Referring to FIG. 5, the writing buffer 133 is further comprised of an inverter INV3, relative to the writing buffer 131 shown in FIG. 3, enabling a writing operation when data held at the second latch node LATN2 is '1'.

Figure 6:
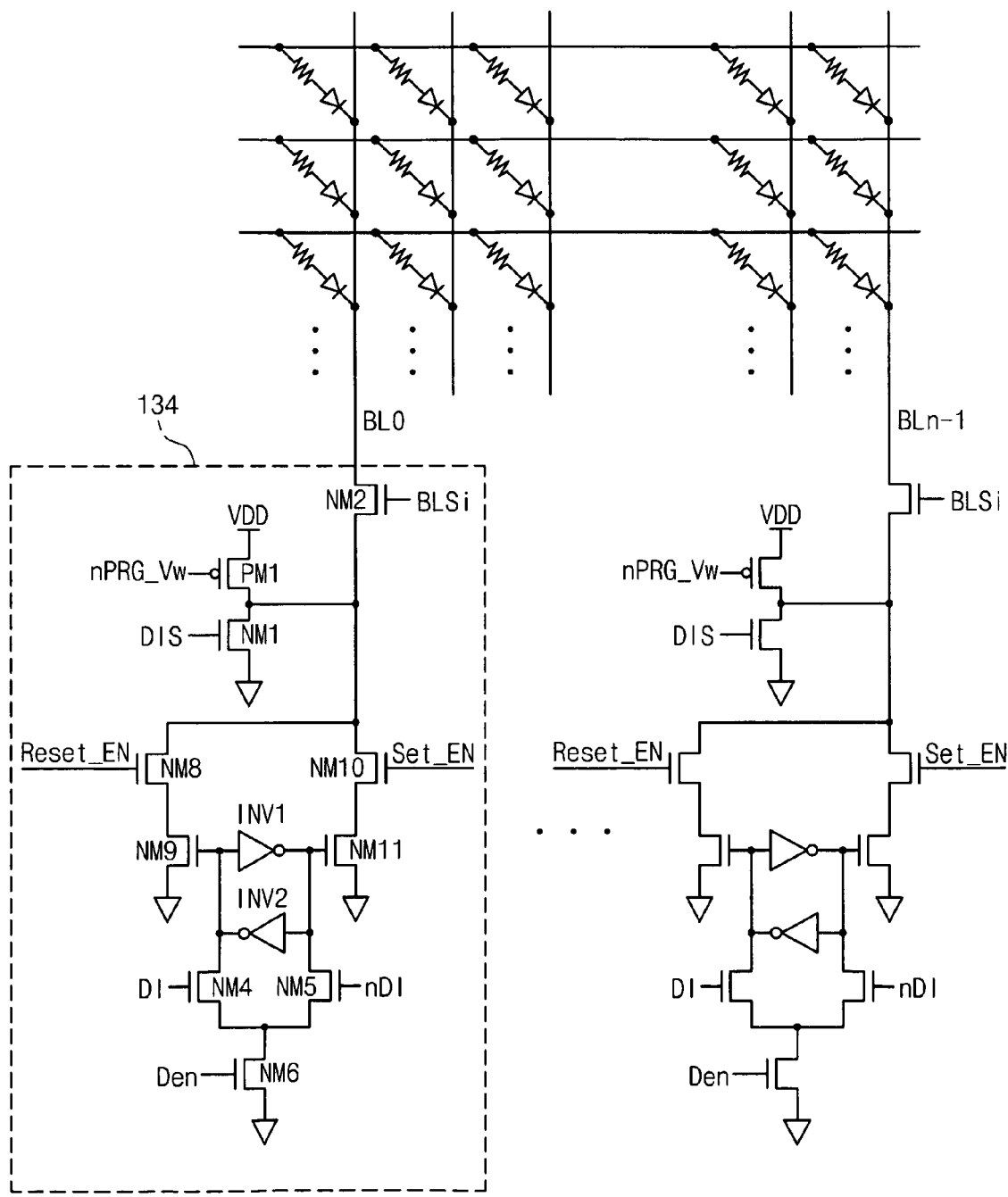
FIG. 6 is a circuit diagram illustrating a fourth embodiment of the writing buffer according to the present invention.

FIG. 6 is a circuit diagram illustrating a writing buffer 134 according to a fourth embodiment of the present invention. Referring to FIG. 6, the writing buffer 134 includes NMOS transistors NM8, NM9, NM10, and NM11 to coincidently execute reset and set operations in a writing mode.

Figure 7:
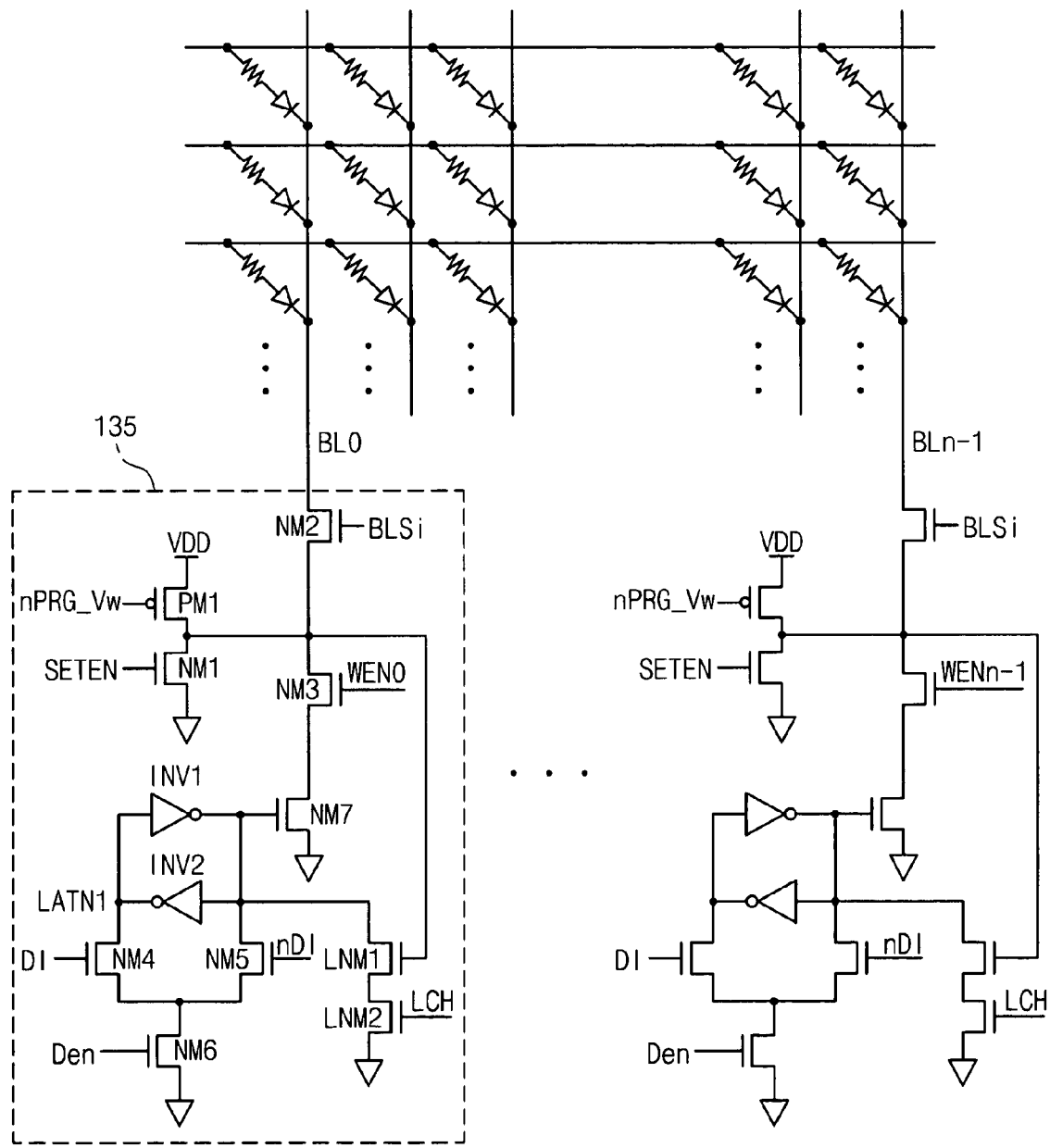
FIG. 7 is a circuit diagram illustrating a fifth embodiment of the writing buffer according to the present invention.
Figure 8:
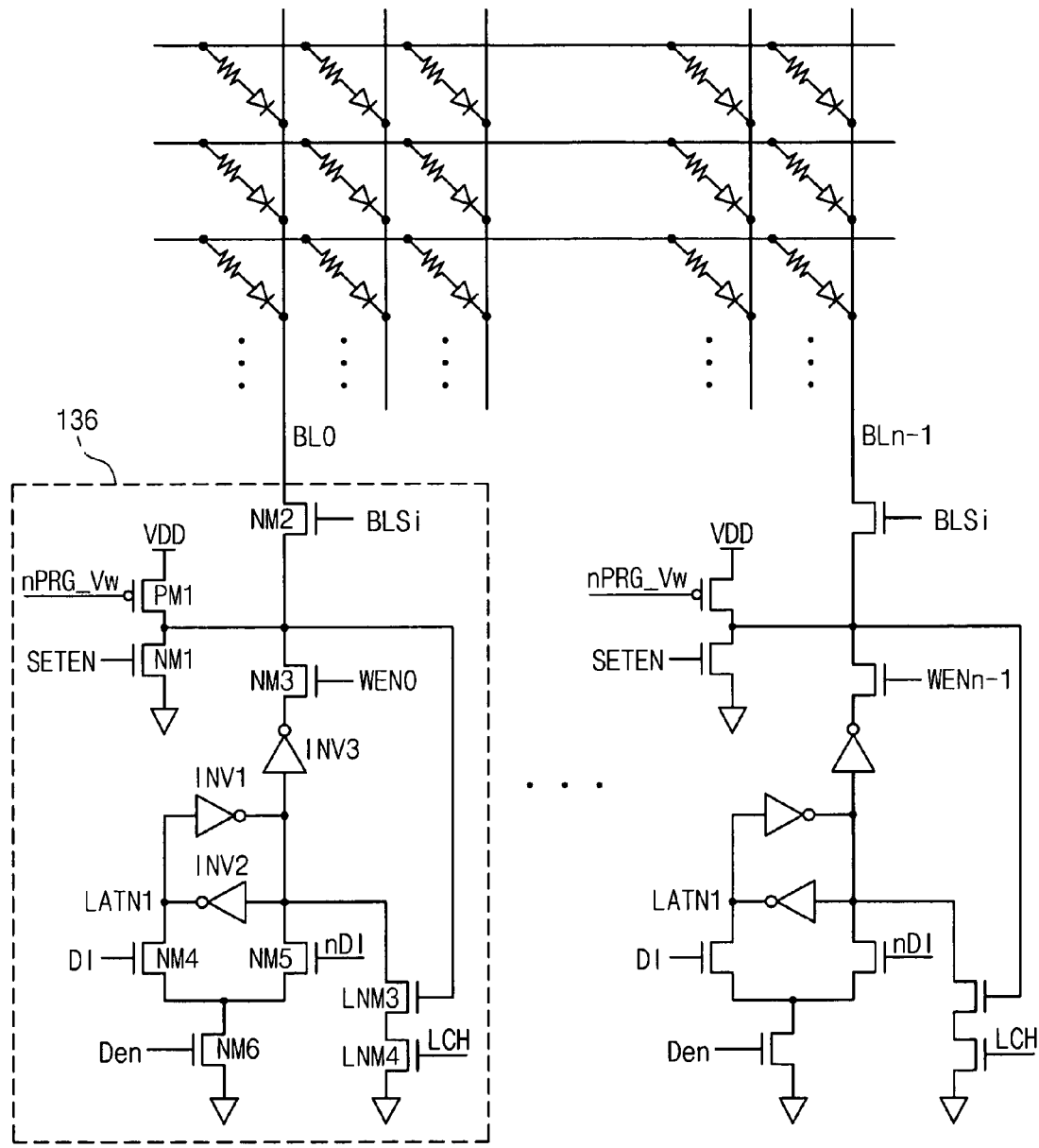
FIG. 8 is a circuit diagram illustrating a sixth embodiment of the writing buffer according to the present invention.
Figure 9:
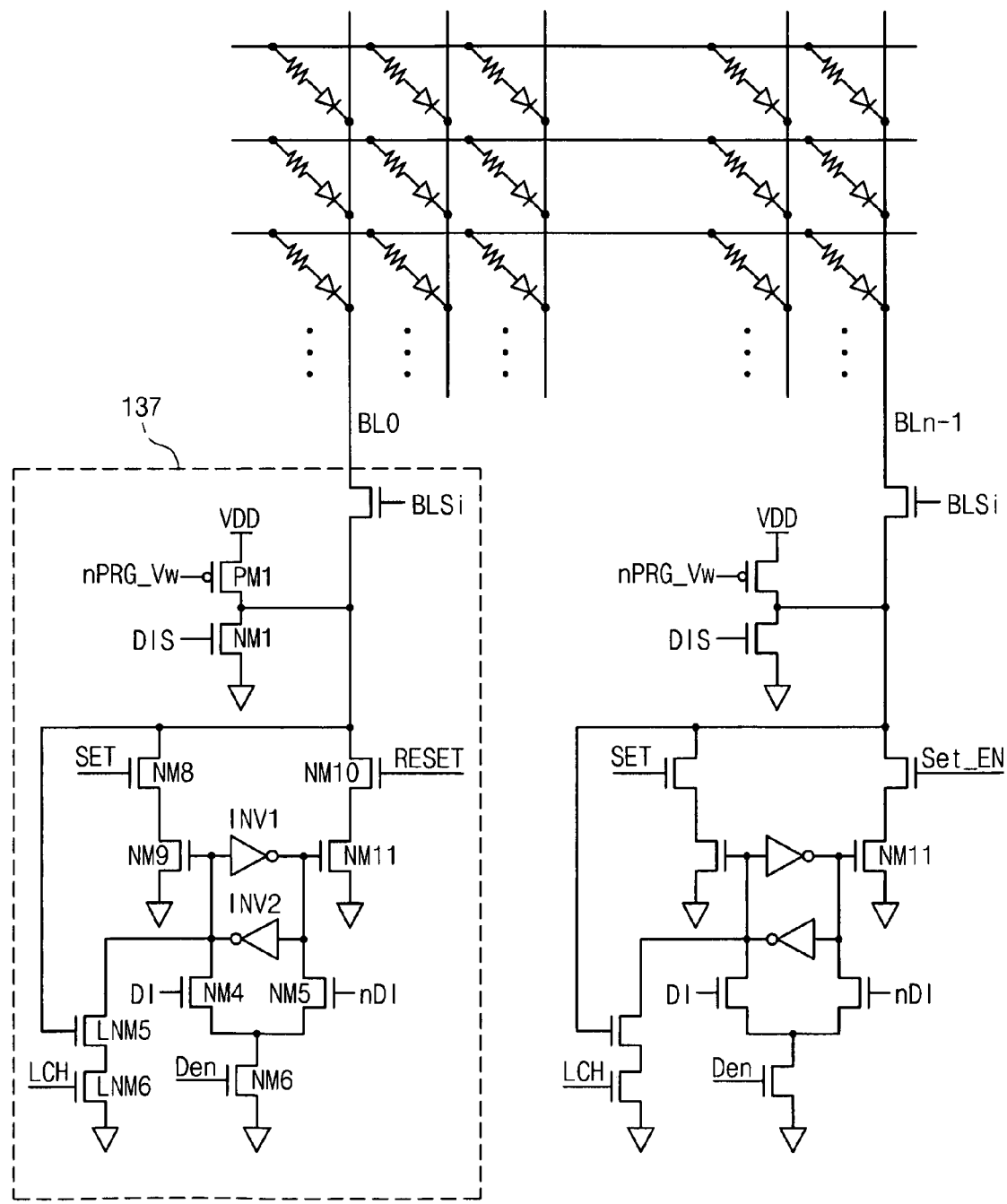
FIG. 9 is a circuit diagram illustrating a seventh embodiment of the writing buffer according to the present invention.

FIGS. 7 through 9 show several embodiments about the reading/writing buffer of the cluster buffer 130 according to the present invention.

FIG. 7 is a circuit diagram illustrating a reading/writing buffer 135 according to a fifth embodiment of the present invention. Referring to FIG. 7, the reading/writing buffer 135 is further comprised of NMOS transistors LNM1 and LNM2, relative to the writing buffer 132 shown in FIG. 4, latching data that is read from a resistive memory cell in a reading operation mode.

FIG. 8 is a circuit diagram illustrating a writing buffer 136 according to a sixth embodiment of the present invention. Referring to FIG. 8, the reading/writing buffer 136 is further comprised of NMOS transistors LNM3 and LNM4, relative to the writing buffer 133 shown in FIG. 5, latching data that is read from a resistive memory cell in a reading operation mode.

FIG. 9 is a circuit diagram illustrating a writing buffer 137 according to a seventh embodiment of the present invention. Referring to FIG. 9, the reading/writing buffer 137 is further comprised of NMOS transistors LNM5 and LNM6, relative to the writing buffer 134 shown in FIG. 6, latching data that is read from a resistive memory cell in a reading operation mode.

Figure 10:
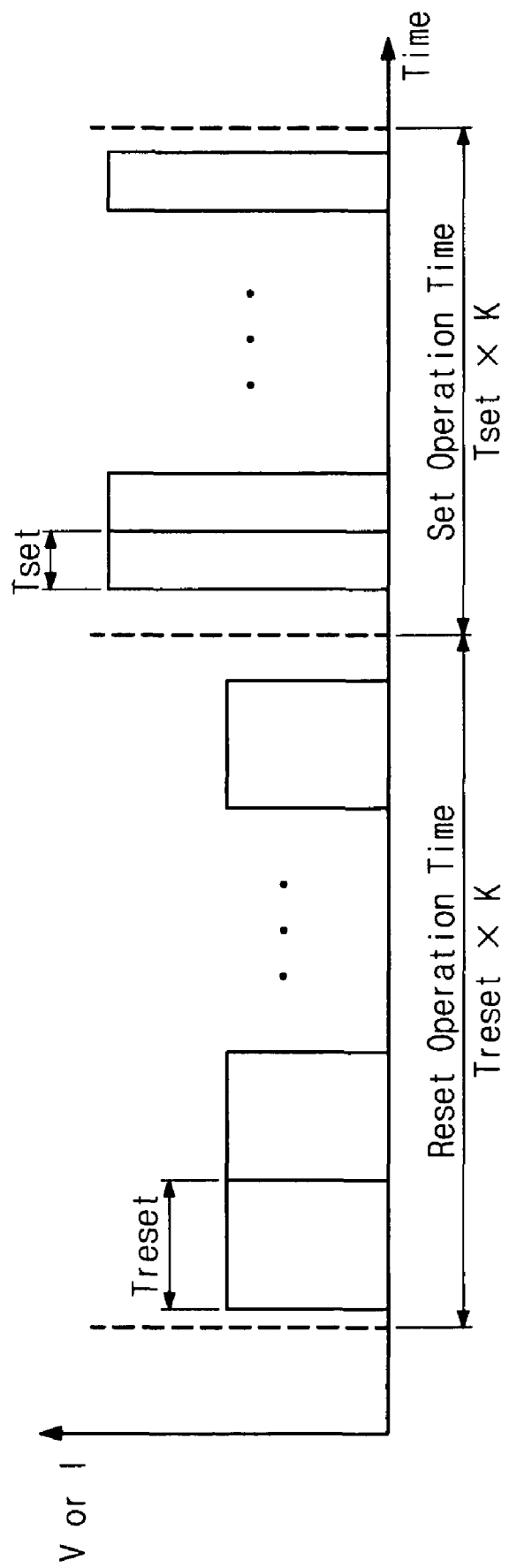
FIG. 10 is a timing diagram showing a case where a reset operation is carried out independently from a set operation during a writing operation in the resistive memory device.

FIG. 10 is a timing diagram showing an embodiment in which a reset operation is carried out independently from a set operation during a writing operation in the resistive memory device 100. Referring to FIG. 10, the resistive memory device 100 according to the present invention operates by carrying out the set operation K times after conducting the reset operation K times. Here, K is equivalent to the number of the bit line groups BLG1~BLGk. In other words, the set operation begins after resetting all of resistive memory cells coupled to a selected word line. Assuming that a time for resetting one bit line group is Treset, the total reset time is Treset×K. Thus, the total writing time of the resistive memory device 100 according to the present invention is (Treset+Tset)×K.

Figure 11:
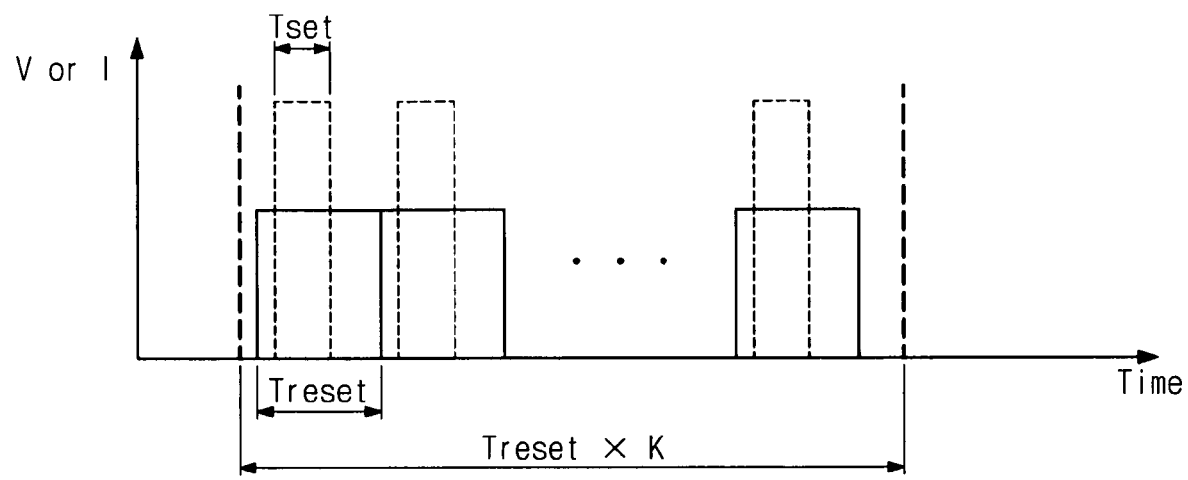
FIG. 11 is a timing diagram showing a case where a reset operation is carried out simultaneously with a set operation during a writing mode in the resistive memory device.

FIG. 11 is a timing diagram showing an embodiment in which a reset operation is carried out simultaneously with a set operation during a writing mode in the resistive memory device 100. Referring to FIG. 11, during the writing mode, the bit line groups BLG1~BLGk are each activated for the reset and set operations which occur simultaneously. Thus, assuming a reset time for each bit line group is Treset and a set time for each bit line group is Tset, the total writing time of the resistive memory device 100 according to the present invention is Treset×K.

Figure 12:
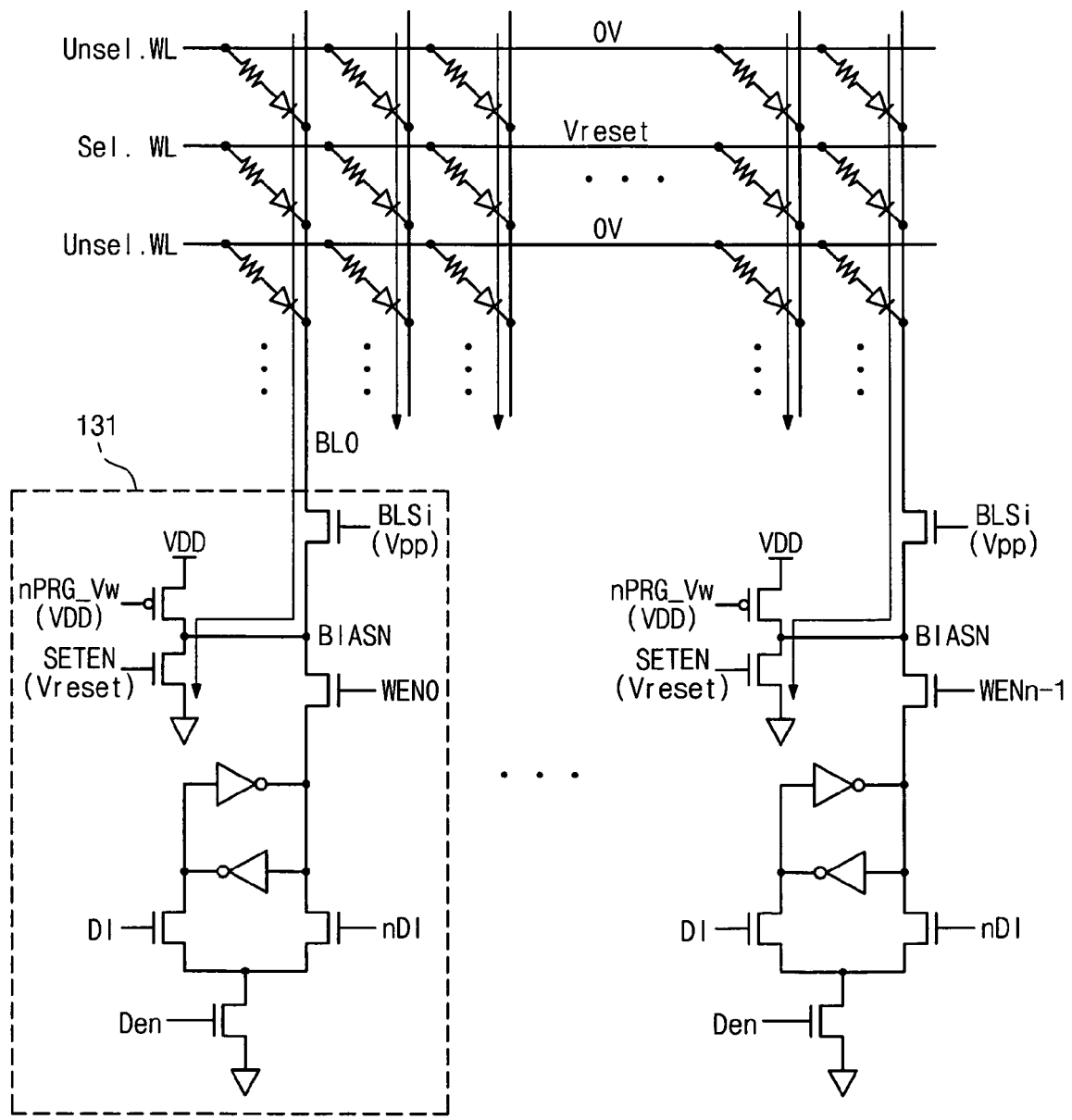
FIG. 12 is a circuit diagram illustrating the reset operation of the resistive memory device with a cluster buffer formed of the writing buffer shown in FIG. 3.
Figure 13:
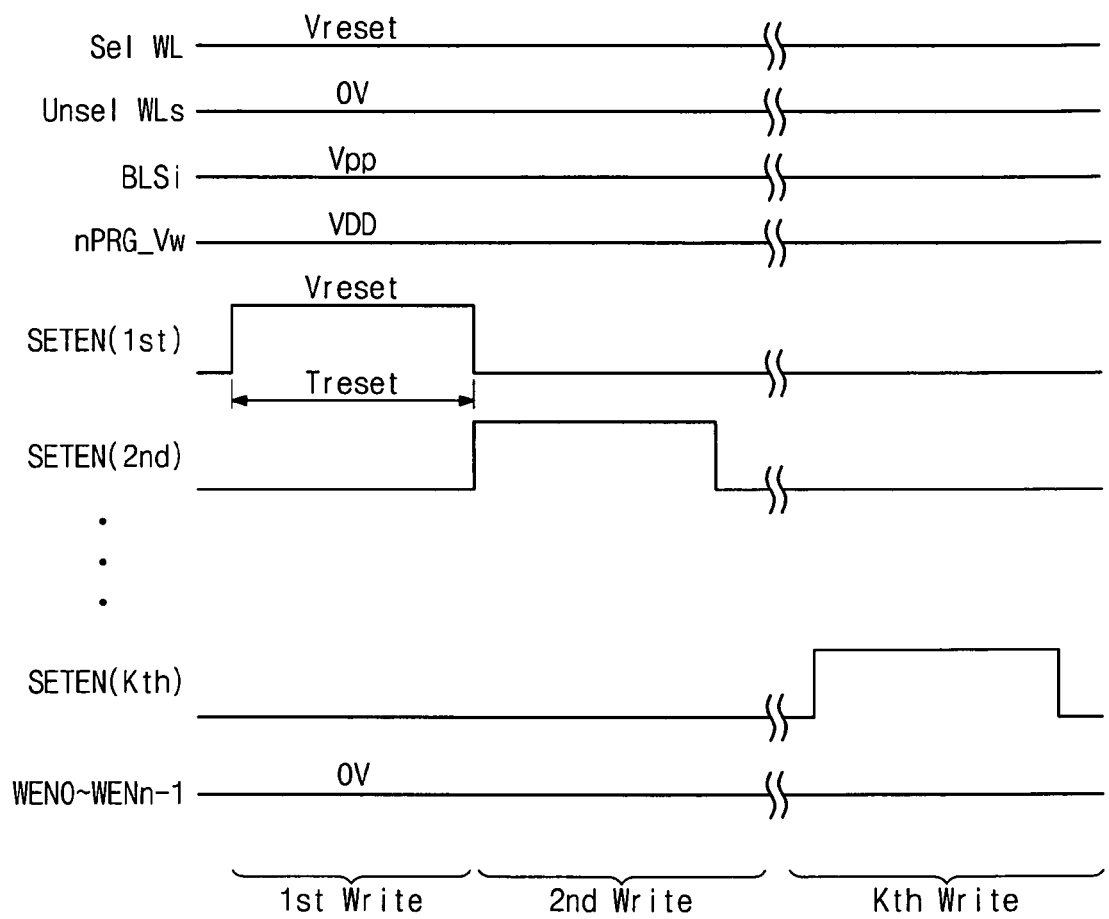
FIG. 13 is a timing diagram illustrating the reset operation of the resistive memory device shown in FIG. 12.
Figure 14:
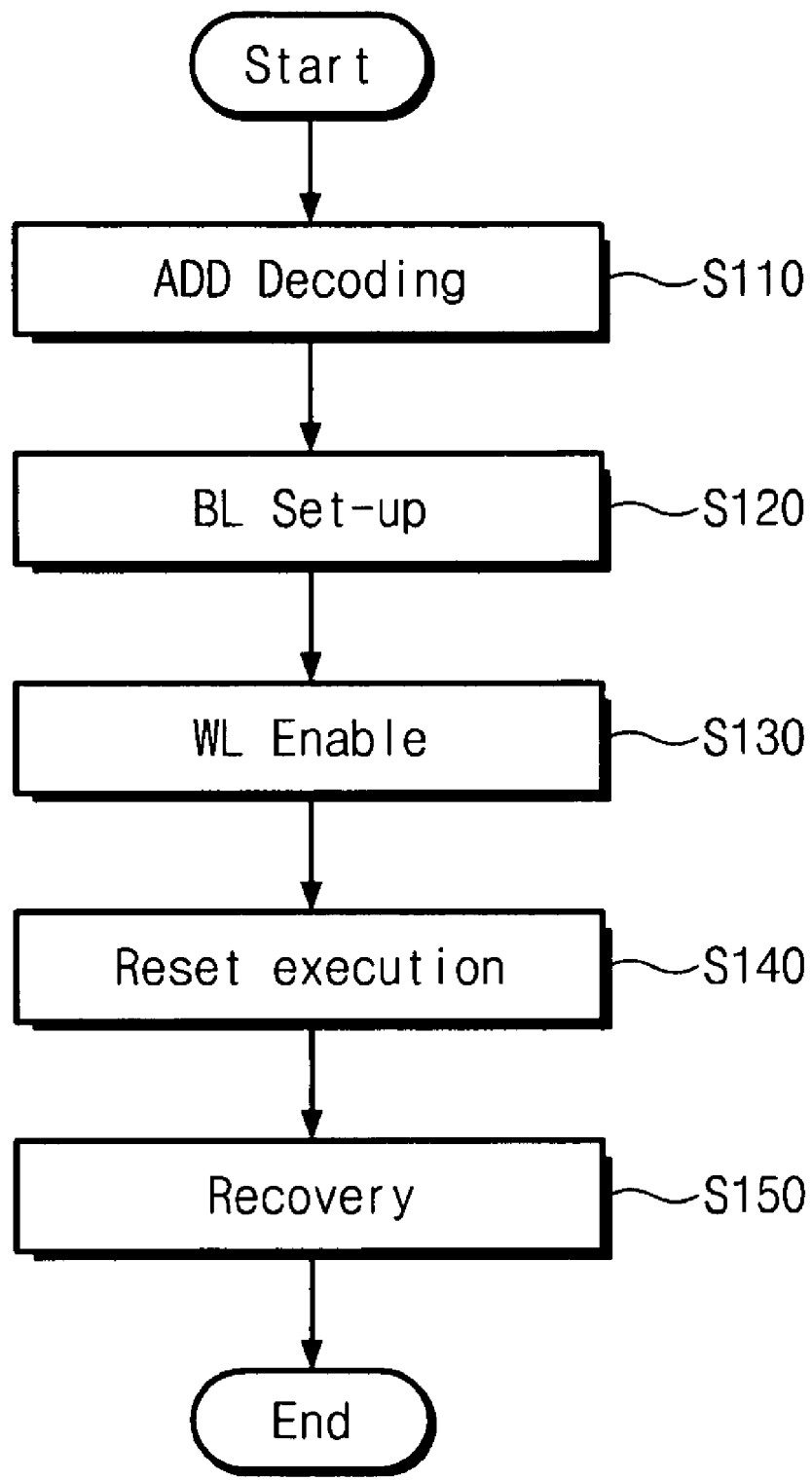
FIG. 14 is a flow chart showing the reset operation of the resistive memory device according to the present invention.

FIG. 12 is a circuit diagram illustrating the reset operation of the resistive memory device with a cluster buffer formed of the writing buffer 131 shown in FIG. 3. FIG. 13 is a timing diagram illustrating the reset operation of the resistive memory device shown in FIG. 12. FIG. 14 is a flow chart showing the reset operation of the resistive memory device according to the present invention. The manner in which the reset operation for the resistive memory cell is carried out will be discussed below with reference to FIGS. 12 through 14.

In step S110, the row decoder 110 decodes a row address ADD to select a word line (Sel WL) to be reset. In step S120, as shown in FIG. 13, the bit line groups BLG1~BLKk are sequentially set up in response to a set-enable signal SETEN. The set-enable signal SETEN, having a reset voltage Vreset, enables a corresponding bit line to be connected to the ground voltage. That is, the set-enable signal SETEN operates with the reset voltage Vreset by bit line group for the reset time Treset. During this, as illustrated in FIG. 13, the bit-line selection signal BLSi has a level of a high voltage Vpp and the writing-voltage applying signal nPRG_Vw has a level of a power source voltage VDD. Word-line enabling signals WEN0~WENn-1 have a level of the ground voltage (0V). In step S130, after completing the bit-line setup of the bit line group, the reset voltage Vreset is applied to the selected word line (Sel WL) and the ground voltage is applied to unselected word lines (Unsel WLs). Thereafter, in step S140, the set-enable signal SETEN is enabled during a predetermined reset time for resetting resistive memory cells coupled to the selected word line (Sel WL). During this, the set-enable signal SETEN activates the plural bit line groups BLG1~BLGk in sequence. In step S150, after completing the reset operation through the sequential activations of the bit line groups BLG1~BLGk, a recovery operation is conducted to connect all of the word lines WL0~WLm-1 and the bit lines BL0~BLn-1 with the ground voltage 0V.

Figure 15:
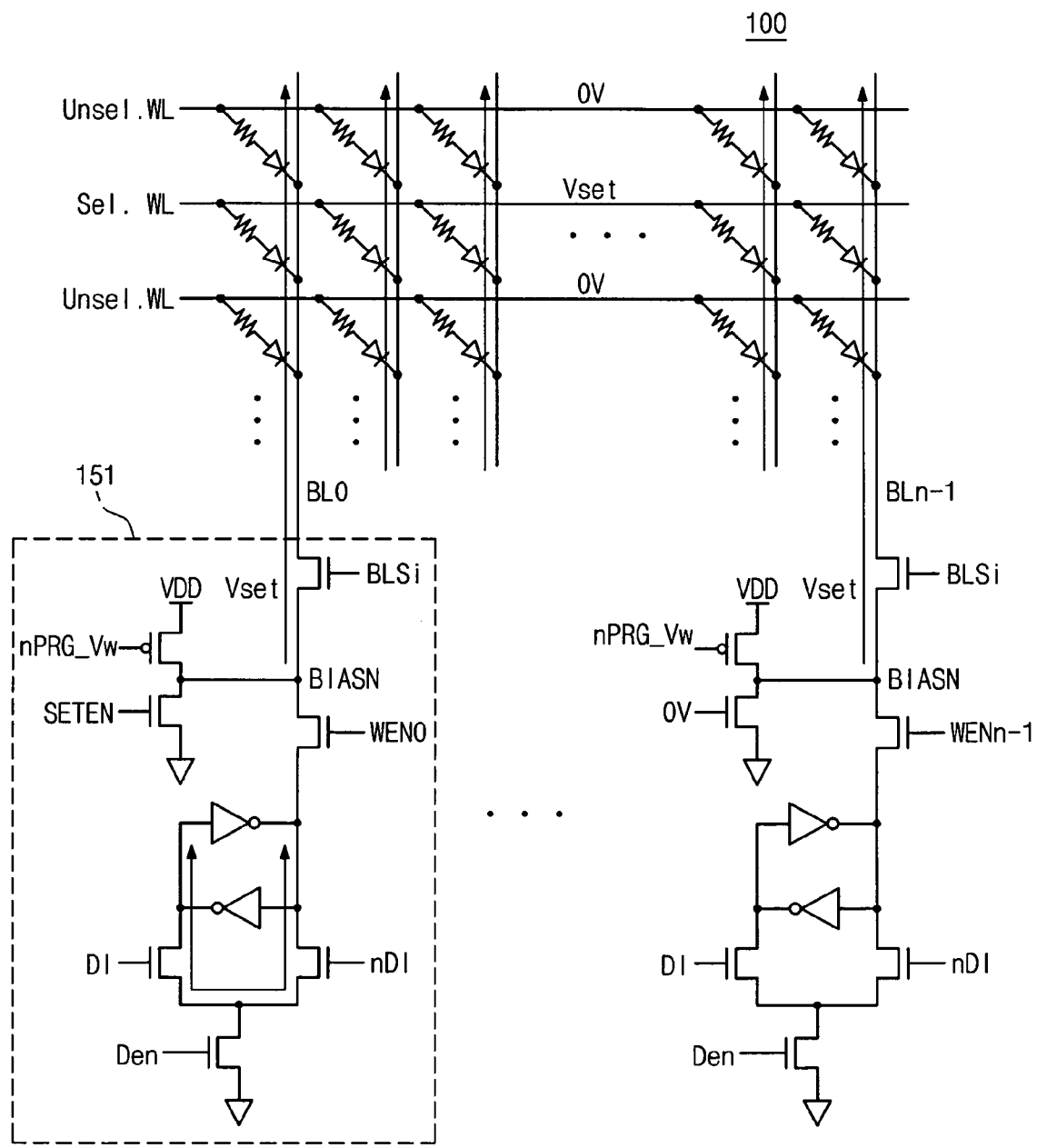
FIG. 15 is a circuit diagram illustrating the set operation of the resistive memory device with the cluster buffer formed of the writing buffer shown in FIG. 3.
Figure 16:
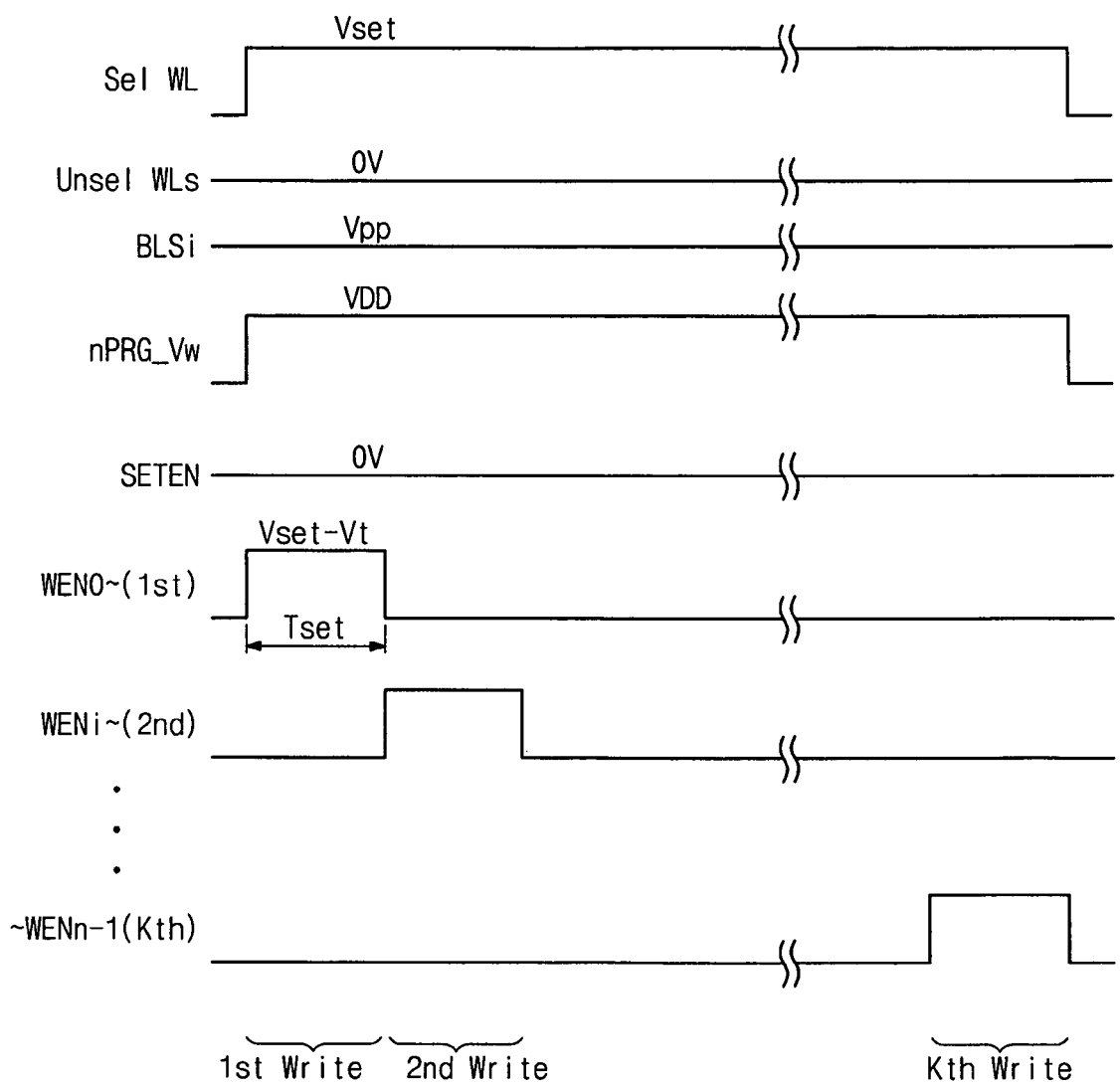
FIG. 16 is a timing diagram illustrating the set operation of the resistive memory device shown in FIG. 15.
Figure 17:
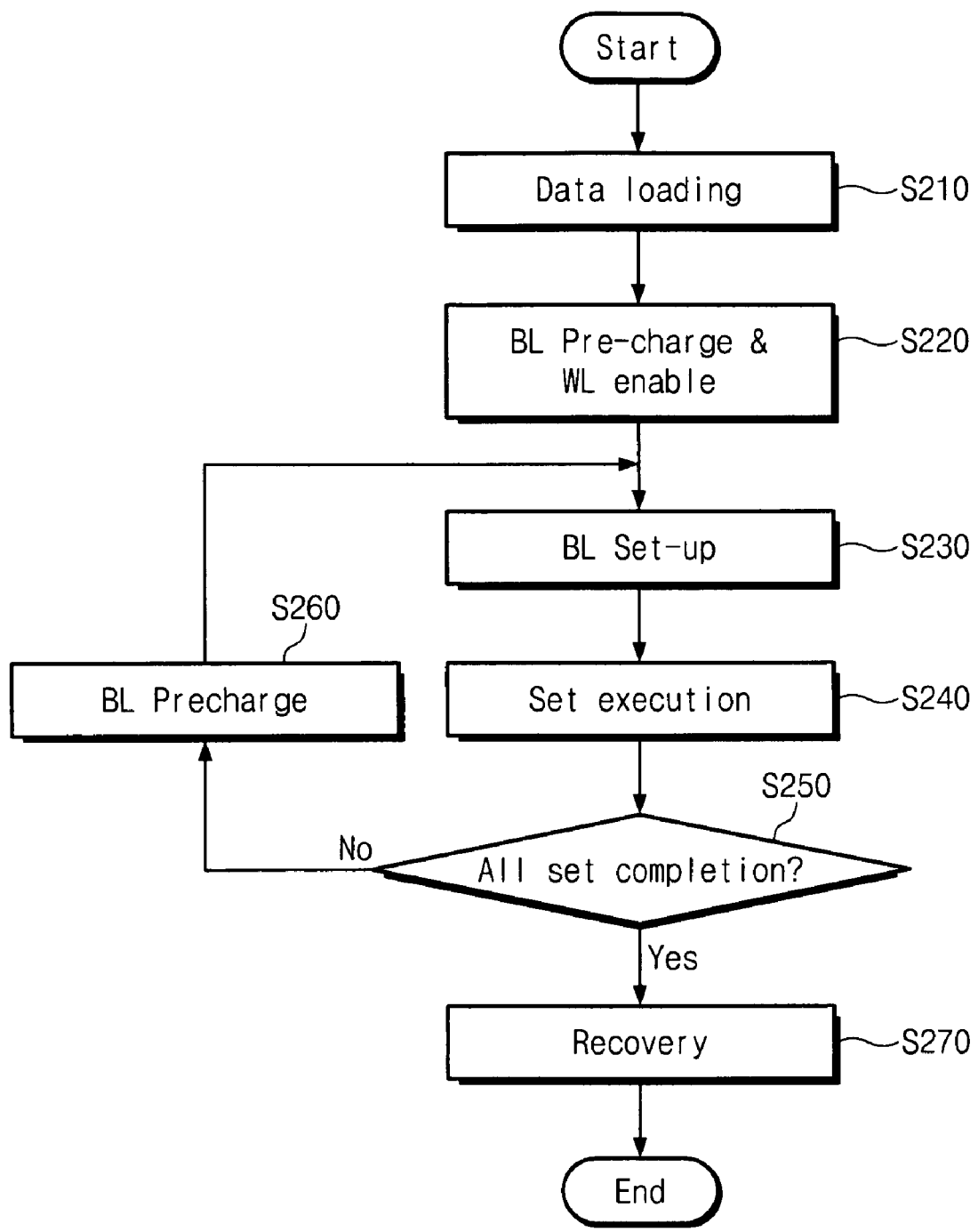
FIG. 17 is a flow chart showing the set operation of the resistive memory device according to the present invention.

FIG. 15 is a circuit diagram illustrating the set operation of the resistive memory device with the cluster buffer formed of the writing buffer 131 shown in FIG. 3. FIG. 16 is a timing diagram illustrating the set operation of the resistive memory device shown in FIG. 15. FIG. 17 is a flow chart showing the set operation of the resistive memory device according to the present invention. Referring to. The manner is which the set operation is carried out for the resistive memory device will be discussed below with reference to FIGS. 15 through 17.

In a writing operation mode, in step S210, data input from an external system is loaded into the cluster buffer 130. The input data is latched at the writing buffer 131 in response to the data-enable signal Den. Then, in step S220, all of the bit lines BL0~BLn-1 and the selected word line (Sel WL) are precharged up to a set voltage Vset. During this, the ground voltage 0V is applied to the unselected word lines (Unsel WLs). Thereafter, the bit line groups BLG1~BLGk are activated in sequence.

As shown in FIG. 13, the word-line enabling signals WEN0~WENn-1 are maintained on a voltage Vset-Vth for the setup time Tset. Thus, in step S230 a bit-line setup is carried out in accordance with data latched in the writing buffer 131 by bit line group. Here, the ground voltage 0V is applied to a bit line connected to resistive memory cells to be set, while the precharging voltage of Vset is applied to bit lines connected to resistive memory cells not to be set.

In Step S240, the setup operation is conducted by applying a voltage corresponding to the latched data, during the setup time Tset, to bit line groups that have been set up. Thereafter, in step S250, the control logic circuit 140 determines whether all of the bit line groups BLG1~BLGk have been successfully set up.

In step S260, if the bit line groups BLG1~BLGk have not been still set up entirely, bit lines belonging to the next bit line group begin to be precharged. Afterwards, the procedure is carried out from the step S230. If the bit line groups BLG1~BLGk have been entirely set up, in step S270 a recovery operation starts to connect all of the word lines WL0~WLm-1 and the bit lines BL0~BLn-1 with the ground voltage 0V. Thereby, the setup operation of the resistive memory device is completed.

Figure 18:
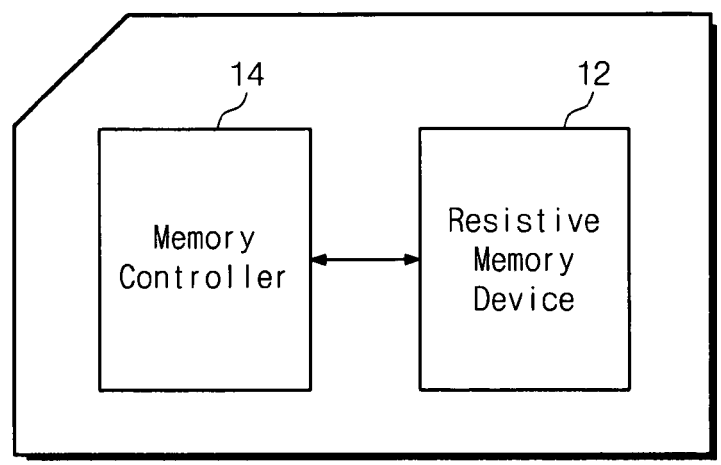
FIG. 18 is a block diagram of a memory card having a resistive memory device according to the present invention.

FIG. 18 is a block diagram of a memory card 10 having a resistive memory device according to the present invention. Referring to FIG. 18, the memory card 10 includes the resistive memory device 12, which is substantially same as that shown in FIG. 1, and a memory controller 14 for controlling the resistive memory device 12. The memory card 10 is used for storing/reading information, along with digital devices such as digital camera, personal data assistant (PDA), portable audio set, mobile phone, personal computer, and so on. These digital devices process data in the unit of cluster. The memory card 10 according to the present invention also processes data in the unit of cluster.

Figure 19:
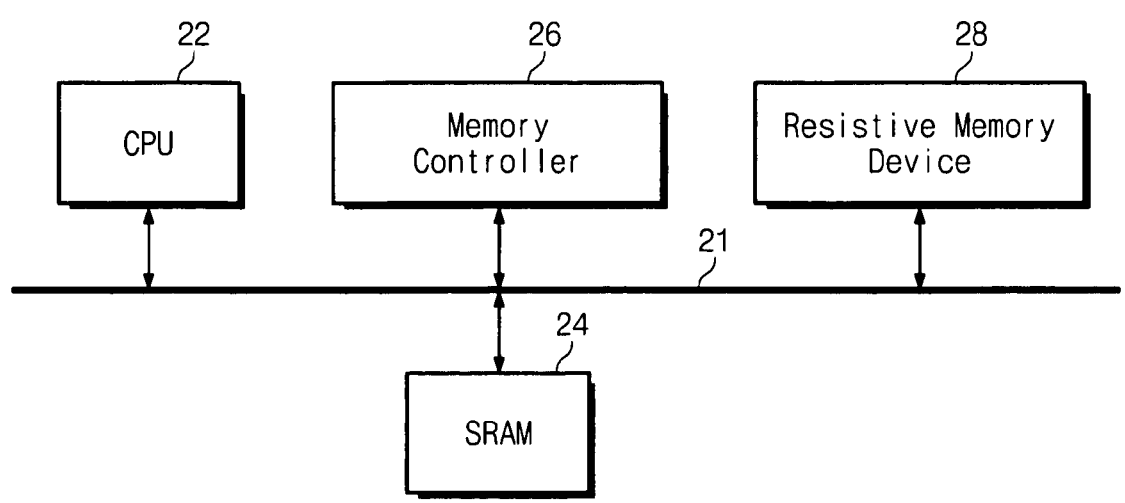
FIG. 19 is a block diagram of a memory system having a resistive memory device according to the present invention.

FIG. 19 is a block diagram of a memory system 20 having a resistive memory device according to the present invention. Referring to FIG. 19, the memory system 20 is organized by including a central processing unit (CPU) 22, a static RAM 24, a memory controller 26, and a resistive memory device 28, all of which are electrically connected to a bus 21. The resistive memory device 28 may be configured in the same manner as that shown in FIG. 1. The resistive memory device 28 stores N-bit data (N is 1 or a positive integer larger than 1), which is processed or to be processed by the CPU 22, by the memory controller 26.

Although not shown in FIG. 19, the memory system 20 may be further equipped with an application chipset, a camera image processor (e.g., complementary metal-oxide-semiconductor (CMOS) image sensor; i.e., CIS), a mobile DRAM, and so forth. The memory controller 26 and the resistive memory device 28, for example, may constitute a memory card and/or memory card system, or a solid state drive/disk (SSD) using a nonvolatile memory for data storage.

The resistive memory device and/or the memory controller according to the present invention can be mounted on the aforementioned system through various types of packages. For instance, the resistive memory device and/or the memory controller may be placed thereon by means of any package type, e.g., Package-on-Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip-On-Board (COB), CERamic Dual In-line Package (CERDIP), Plastic Metric Quad Flat Pack (MQFP), Thin Quad Flat Pack (TQFP), Small Outline (SOIC), Shrink Small Outline Package (SSOP), Thin Small Outline (TSOP), Thin Quad Flat Pack (TQFP), System In Package (SIP), Multi-Chip Package (MCP), Wafer-level Fabricated Package (WFP), Wafer-level Processed Stack Package (WSP), or Wafer-level Processed Package (WSP).

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A writing method of a resistive memory device, comprising:
   precharging a plurality of word lines and a plurality of bit lines;
   dividing the plurality of bit lines into a plurality of bit line groups;
   setting up the plurality of bit line groups, in sequence, by selectively applying voltages to bit lines from among each of the bit line groups to precondition the bit lines of the bit line groups for a writing operation; and
   performing the writing operation by applying a writing voltage to a selected one of the plurality of word lines,
   wherein after a writing operation to resistive memory cells corresponding to a first one of the bit line groups, the bit lines belonging to a second bit-line group are set up and the bit lines belonging to the first bit-line group are precharged, simultaneously, while performing a writing operation to resistive memory cells corresponding to the second bit-line group.

2. The method of claim 1, wherein precharging the bit lines of the first bit-line group includes applying a precharging voltage to each of the bit lies of the first bit-line group.

3. The method of claim 1, wherein setting up the bit lines of the second bit-line group includes applying a write-inhibit voltage to each bit line of the second bit-line group not being written to, and applying a writing voltage to each bit line of the second bit-line group being written to.

4. The method of claim 1, further comprising:
   conducting a reset operation; and
   conducting a set operation,
   wherein the reset operation is conducted independently from the set operation in a writing mode.

5. The method of claim 4, wherein the reset operation is performed for all of the resistive memory cells coupled to the selected word line and performed for each of the plurality of bit line groups in sequence.

6. The method of claim 5, wherein the set operation is performed selectively for all of the resistive memory cells coupled to the selected word line, which are to be set and have been reset, the set operation being performed by the bit lines in sequence.

7. The method of claim 1, further comprising:
   conducting a reset operation; and
   conducting a set operation,
   wherein the reset and set operations are conducted simultaneously in a writing mode.

8. The method of claim 1, wherein input data is configured in a unit of a cluster.

9. A resistive memory device comprising:
   a memory cell array having a plurality of resistive memory cells arranged on intersections of a plurality of word lines and a plurality of bit lines, the bit lines being dived into a plurality of bit line groups;
   a row decoder configured to select a word line by decoding an input address;

a cluster buffer configured to store data input during a writing mode, and store data read from the memory cell array in a reading mode; and a control logic circuit configured to control precharging of the word and bit lines in the writing mode, and to control the row decoder and the cluster buffer to apply a writing voltage to a selected word line and to perform a bit-line setup by selectively applying voltages to bit lines from among each of the bit line groups, in sequence, to pre-condition the bit lines of the bit line groups for a writing operation, wherein the control logic unit is configured so that, after a writing operation to resistive memory cells corresponding to a first one of the bit line groups, the control logic unit controls bit lines belonging to a second bit-line group to be set up and the bit lines belonging to the first bit-line group to be precharged, simultaneously, during writing operation to resistive memory cells corresponding to the second bit-line group.

10. The device of claim 9, wherein the cluster buffer further comprises a plurality writing buffers connected to each of the bit lines, wherein each writing buffer includes a latch configured to hold data corresponding with reset and set operations in the writing mode.

11. The device of claim 9, wherein each writing buffer further comprises a transistor configured to enable a writing operation based on data held in the latch.

12. The device of claim 9, wherein each writing buffer further comprises an inverter configured to enable a writing operation based on data held in the latch.

13. The device of claim 9, wherein each resistive memory cell comprises:

a variable resistor having a phase-changeable material with two different resistance values corresponding with crystalline and amorphous states; and an access element controlling a current flowing through the variable resistor.

* * * * *